US011153975B2

(12) United States Patent
Suzuki (10) Patent No.: US 11,153,975 B2
(45) Date of Patent: Oct. 19, 2021

(54) WIRING BOARD MANUFACTURING METHOD

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 24 days.

(21) Appl. No.: 16/671,447

(22) Filed: Nov. 1, 2019

(65) Prior Publication Data

US 2020/0146158 A1    May 7, 2020

(30) Foreign Application Priority Data

Nov. 5, 2018   (JP) .............................. JP2018-208323

(51) Int. Cl.
*H05K 3/30* (2006.01)
*H05K 3/00* (2006.01)

(52) U.S. Cl.
CPC ........... *H05K 3/303* (2013.01); *H05K 3/0044* (2013.01)

(58) Field of Classification Search
CPC ................. H05K 3/303; H05K 3/0044; H05K 2203/1572; H05K 1/0366; H05K 2203/025; H05K 3/06; H05K 3/0011; B24B 49/12; Y10T 29/49155; Y10T 29/49158
USPC .................................................... 29/846, 848
See application file for complete search history.

(56) References Cited

U.S. PATENT DOCUMENTS

| | | | | |
|---|---|---|---|---|
| 2,716,268 A | * | 8/1955 | Steigerwalt | H05K 3/045 29/848 |
| 4,327,143 A | * | 4/1982 | Alvino | H05K 1/036 174/259 |
| 8,119,925 B2 | * | 2/2012 | Yoshimura | H05K 3/4641 174/258 |
| 8,128,458 B2 | * | 3/2012 | Saito | B24B 49/12 451/6 |
| 2012/0305182 A1 | * | 12/2012 | Azami | B32B 15/20 156/306.6 |
| 2014/0318834 A1 | * | 10/2014 | Tsuchida | H05K 3/4602 29/831 |

FOREIGN PATENT DOCUMENTS

| | | |
|---|---|---|
| JP | 2001196743 A | 7/2001 |
| JP | 2013080823 A | 5/2013 |

* cited by examiner

*Primary Examiner* — Donghai D Nguyen
(74) *Attorney, Agent, or Firm* — Greer, Burns & Crain, Ltd.

(57) ABSTRACT

A wiring board manufacturing method includes a sheet laminate forming step of impregnating a glass cloth with a synthetic resin to form a plurality of sheets and next stacking these sheets to form a sheet laminate having a first surface and a second surface, a core member forming step of stacking a release plate on the first surface of the sheet laminate, stacking an electrode plate on the second surface of the sheet laminate, next using a pressure plate to press the release plate, the sheet laminate, and the electrode plate in their stacked condition, thereby uniting them together to form a core member, and a grinding step of grinding the release plate of the core member in a condition where the electrode plate of the core member is held on a chuck table, thereby making a thickness of the core member uniform.

6 Claims, 9 Drawing Sheets

WIRING BOARD MANUFACTURING METHOD

BACKGROUND OF THE INVENTION

Field of the Invention

The present invention relates to a wiring board manufacturing method.

Description of the Related Art

Conventionally, package device chips or the like are bonded to a copper-clad laminate called a printed board. The copper-clad laminate is formed by impregnating a glass cloth with resin to form a sheet, next stacking copper foils on both sides of the sheet, and next applying a pressure and heat to the sheet with the copper foils (see JP 2001-196743A and JP 2013-80823A, for example). Further, the copper-clad laminate may include a plurality of glass cloths impregnated with resin and stacked to form a sheet.

SUMMARY OF THE INVENTION

The copper-clad laminate described in the above publications has variations in thickness and large asperities on both sides. Accordingly, this copper-clad laminate cannot be applied to such a case where the distance between electrodes on each package device chip is very small. That is, a wiring layer of metal is formed on the upper surface of the copper-clad laminate to form electrodes, which are adapted to be connected to the electrodes of the package device chips. However, the asperities on the upper surface of the copper-clad laminate cause variations in height of the wiring layer. As a result, there is a possibility of poor connection between the electrodes of the wiring board and the electrodes of the package device chips.

It is therefore an object of the present invention to provide a wiring board manufacturing method which can suppress poor connection between the electrodes of the wiring board and the electrodes of the package device chips as the components to be mounted on the wiring board.

In accordance with an aspect of the present invention, there is provided a wiring board manufacturing method for manufacturing a wiring board on which a plurality of package device chips having electrodes are adapted to be mounted, the wiring board having electrodes adapted to be connected to the electrodes of the package device chips, the wiring board manufacturing method including a sheet laminate forming step of impregnating a glass cloth with a synthetic resin to form a plurality of sheets and next stacking the sheets to form a sheet laminate having a first surface and a second surface; a core member forming step of stacking a release plate on the first surface of the sheet laminate, stacking an electrode plate on the second surface of the sheet laminate, next using a pressure plate to press the release plate, the sheet laminate, and the electrode plate in their stacked condition, thereby uniting the release plate, the sheet laminate, and the electrode plate to form a core member; a front grinding step of grinding the release plate of the core member as the front side of the core member in a condition where the electrode plate of the core member as the back side of the core member is held on a chuck table, thereby making a thickness of the core member uniform and removing at least a part of the release plate to thereby form a flat surface on the front side of the core member; and a first wiring layer forming step of forming a wiring layer on the flat surface formed in the front grinding step, the wiring layer being adapted to be connected to the package device chips.

Preferably, the wiring board manufacturing method further includes a second wiring layer forming step of forming another wiring layer on the electrode plate of the core member after performing the first wiring layer forming step.

Preferably, the front grinding step is performed by using abrasive members, cutting tool, polishing belt, or cutting blade.

Preferably, the release plate is formed from a copper plate or a resin film. Preferably, the wiring board manufacturing method further includes a back grinding step of grinding the electrode plate of the core member as the back side of the core member after performing the front grinding step, thereby flattening the back side of the core member.

The wiring board manufacturing method of the present invention has an effect that it is possible to suppress poor connection between the electrodes of the wiring board and the electrodes of the package device chips as the components to be mounted on the wiring board.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described in detail with reference to the drawings. The present invention is not limited to the preferred embodiments. Further, the components used in the preferred embodiments may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
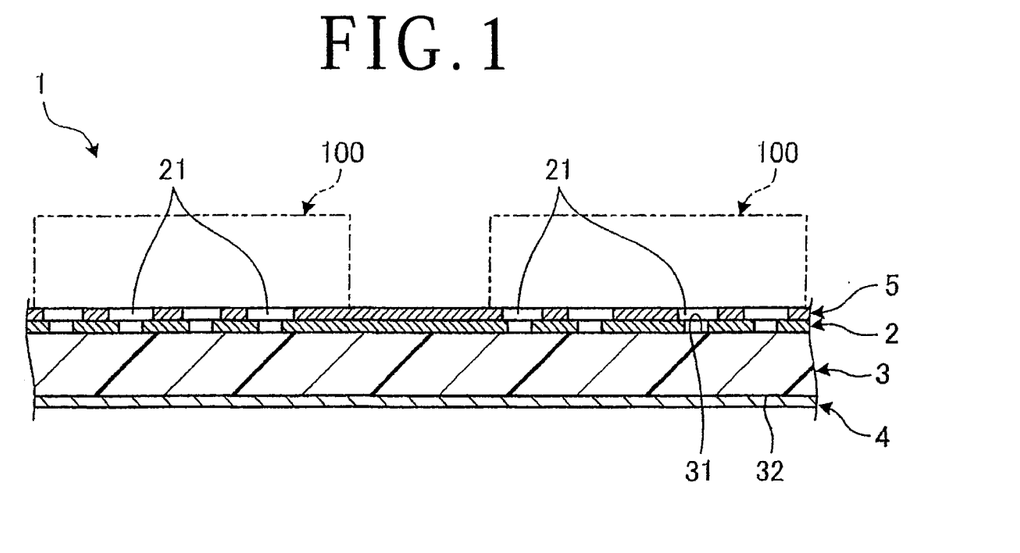
FIG. 1 is a sectional view depicting a part of a wiring board to be manufactured by a wiring board manufacturing method according to a first preferred embodiment of the present invention.

A wiring board manufacturing method according to a first preferred embodiment of the present invention will now be described with reference to the drawings. FIG. 1 is a sectional view depicting a part of a wiring board 1 to be manufactured by the wiring board manufacturing method according to the first preferred embodiment.

The wiring board 1 depicted in FIG. 1 is a wiring board on which a plurality of package device chips 100 are adapted to be mounted and connected through electrodes. More specifically, the wiring board 1 has a wiring layer 2 on the front side, and the wiring layer 2 has a plurality of electrodes 21. Each package device chip 100 has a plurality of electrodes (not depicted), which are adapted to be connected to the electrodes 21 of the wiring layer 2 of the wiring board 1. As depicted in FIG. 1, the wiring board 1 includes an insulating sheet laminate 3 having a first surface 31 and a second surface 32, a conductive wiring layer 2 formed on the first surface 31 of the sheet laminate 3, and an electrode plate 4 formed on the second surface 32 of the sheet laminate 3. The wiring layer 2 is formed of conductive metal such as copper alloy.

The wiring layer 2 is formed by bonding a copper foil or the like on the first surface 31 of the sheet laminate 3 and next partially removing the copper foil at suitable positions. The electrode plate 4 is formed by bonding a copper plate or the like on the second surface 32 of the sheet laminate 3. Unlike the wiring layer 2, the electrode plate 4 has no holes.

Further, an insulating layer 5 is formed on the wiring layer 2. The insulating layer 5 is formed of insulating synthetic resin or the like. The insulating layer 5 is formed by forming a resin film on the wiring layer 2 and next partially removing the resin film at suitable positions. In FIG. 1, the electrodes 21 of the wiring layer 2 are depicted by blank portions.

Figure 2:
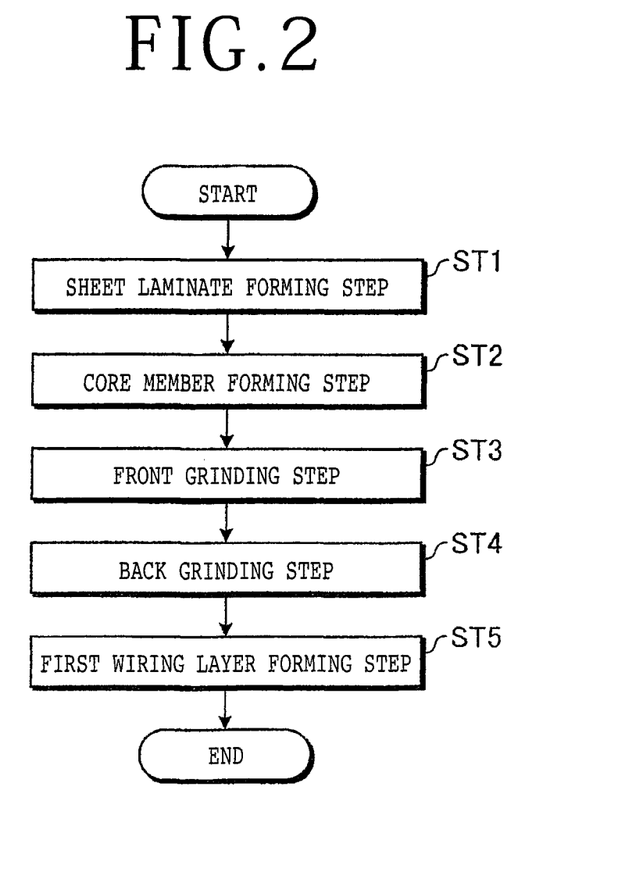
FIG. 2 is a flowchart depicting the flow of the wiring board manufacturing method according to the first preferred embodiment.

The wiring board manufacturing method according to the first preferred embodiment will now be described. FIG. 2 is a flowchart depicting the flow of the wiring board manufacturing method according to the first preferred embodiment. The wiring board manufacturing method according to the first preferred embodiment is a method for manufacturing the wiring board 1 depicted in FIG. 1. As depicted in FIG. 2, the wiring board manufacturing method according to the first preferred embodiment includes a sheet laminate forming step ST1, a core member forming step ST2, a front grinding step ST3, a back grinding step ST4, and a first wiring layer forming step ST5.

Sheet Laminate Forming Step

Figure 3:
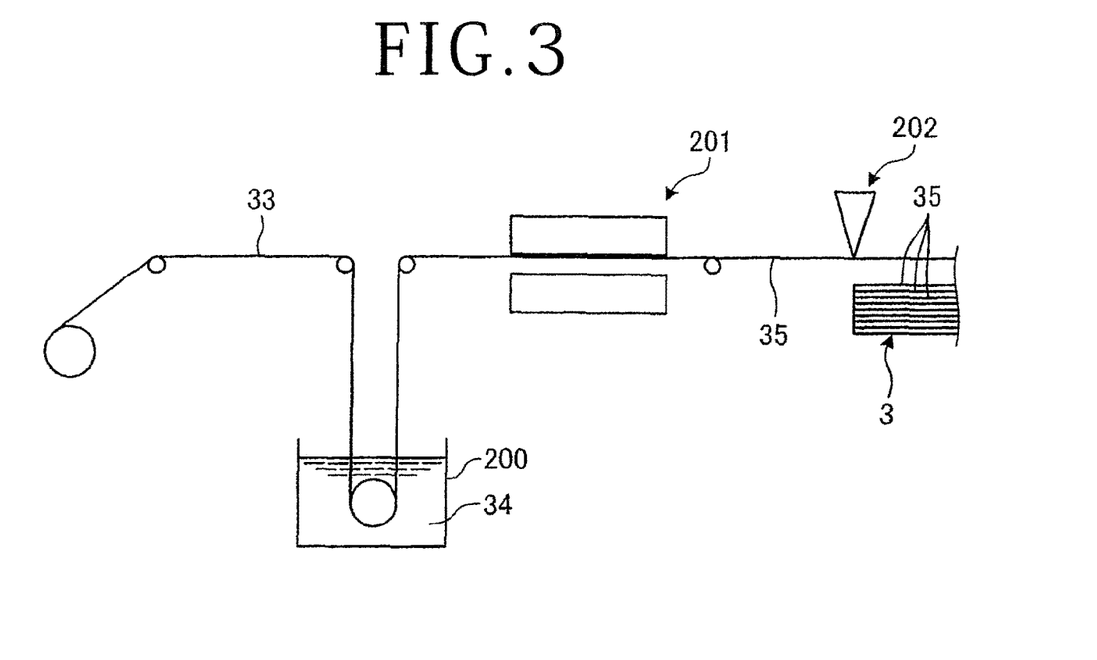
FIG. 3 is a schematic view depicting a sheet laminate forming step in the wiring board manufacturing method depicted in FIG. 2.

FIG. 3 is a schematic view depicting the sheet laminate forming step ST1 in the wiring board manufacturing method depicted in FIG. 2. The sheet laminate forming step ST1 is a step of forming a sheet laminate 3 by impregnating a glass cloth 33 with a varnish 34 as a synthetic resin to form a sheet 35, next cutting the sheet 35 into a plurality of sheets, and next stacking these sheets. That is, the sheet laminate 3 is composed of the plural sheets 35 stacked, each sheet 35 being formed by impregnating the glass cloth 33 with the varnish 34.

The glass cloth 33 is formed by weaving glass fiber. In the sheet laminate forming step ST1, the glass cloth 33 is set in the form of a roll. The glass cloth 33 is drawn from the roll and fed to an impregnating vat 200 containing the varnish 34 as being guided by a plurality of rollers. In the impregnating vat 200, the glass cloth 33 is impregnated with the varnish 34. The varnish 34 is a synthetic resin such as epoxy resin, phenol resin, and polyether ether ketone (PEEK) resin in the condition before curing.

As depicted in FIG. 3, the glass cloth 33 is passed through the varnish 34 contained in the impregnating vat 200, so that the glass cloth 33 is impregnated with the varnish 34, thereby forming the sheet 35. Thereafter, the sheet 35 is passed through a heating unit 201, so that the sheet 35 is heated and dried by the heating unit 201, thereby curing the varnish 34 included in the sheet 35. Thereafter, the sheet 35 is cut into a plurality of sheets each having a predetermined size by a cutting unit 202. Thereafter, the plural sheets 35 obtained above are stacked to form the sheet laminate 3. Thereafter, the method proceeds to the core member forming step ST2.

Core Member Forming Step

Figure 4:
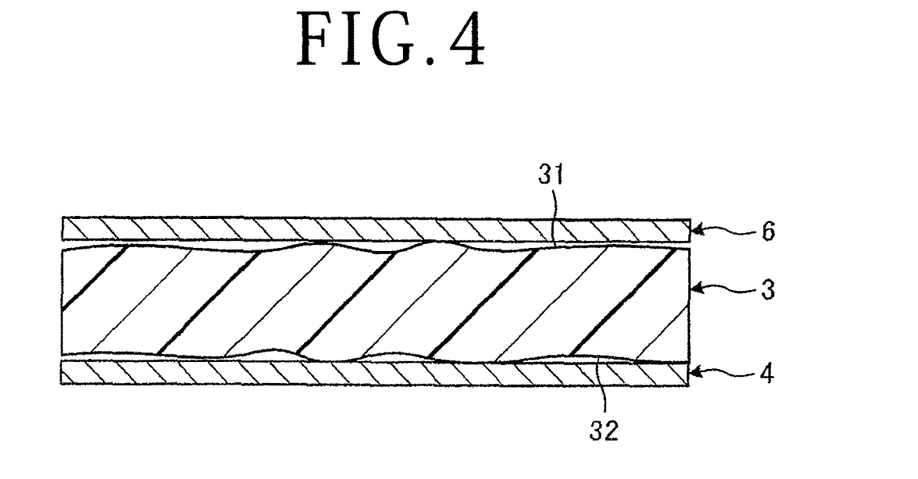
FIG. 4 is a schematic sectional view depicting a condition where a release plate and an electrode plate are stacked on both sides of the sheet laminate in a core member forming step in the wiring board manufacturing method depicted in FIG. 2.
Figure 5:
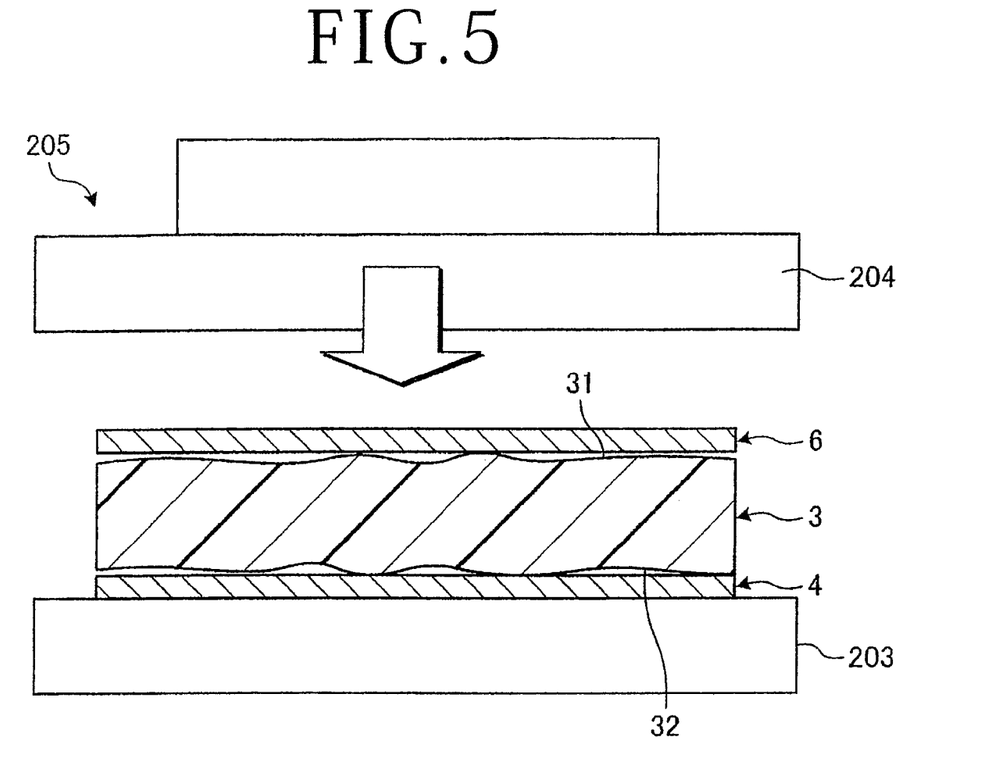
FIG. 5 is a schematic sectional view depicting a condition where the release plate, the sheet laminate, and the electrode plate are pressed together in the core member forming step.
Figure 6:
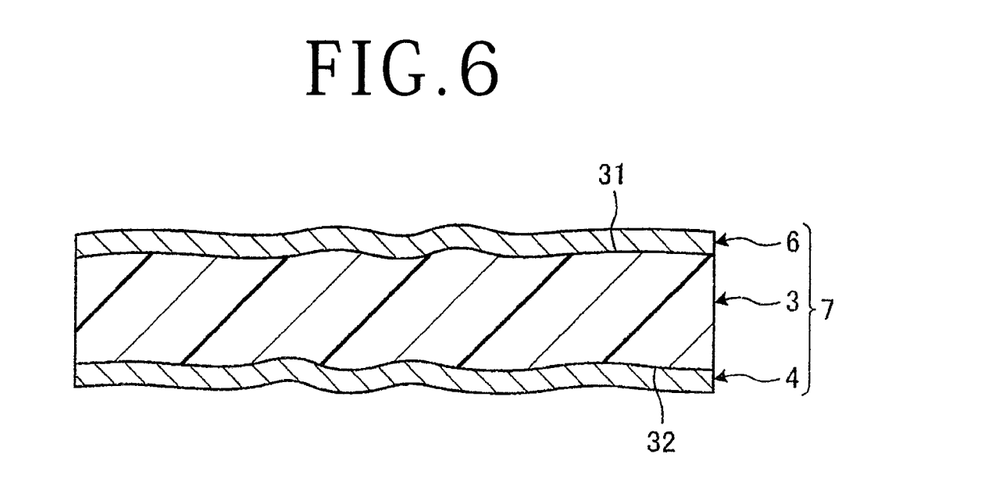
FIG. 6 is a schematic sectional view of a core member formed in the core member forming step.

FIG. 4 is a schematic sectional view depicting a condition where a release plate 6 and an electrode plate 4 are stacked on both sides of the sheet laminate 3 in the core member forming step ST2 depicted in FIG. 2. FIG. 5 is a schematic sectional view depicting a condition where the release plate 6, the sheet laminate 3, and the electrode plate 4 are pressed together in the core member forming step ST2 depicted in FIG. 2. FIG. 6 is a schematic sectional view of a core member 7 formed in the core member forming step ST2 depicted in FIG. 2. In the drawings, the asperities on the first surface 31 and the second surface 32 of the sheet laminate 3 and on the opposite surfaces of the core member 7 are exaggerated.

As depicted in FIGS. 4 and 5, the core member forming step ST2 is a step of forming the core member 7 (see FIG. 6) by first stacking the release plate 6 on the first surface 31 of the sheet laminate 3, stacking the electrode plate 4 on the second surface 32 of the sheet laminate 3, and next using a pressing machine 205 having a pair of pressure plates 203 and 204 to press the release plate 6, the sheet laminate 3, and the electrode plate 4 in their stacked condition. That is, the core member 7 is composed of the sheet laminate 3, the release plate 6, and the electrode plate 4 united together. More specifically, as depicted in FIG. 4, the release plate 6 is stacked on the first surface 31 of the sheet laminate 3, and the electrode plate 4 is stacked on the second surface 32 of the sheet laminate 3.

Both the release plate 6 and the electrode plate 4 have the same shape and size as those of the sheet laminate 3 as viewed in plan. The release plate 6 may be formed from a copper plate of copper alloy for prevention of adherence to the pressure plate 204, a resin film for formation of a redistribution layer, such as Ajinomoto Build-up Film (which will be hereinafter referred to as "ABF") manufactured by Ajinomoto Fine-Techno Co., Inc., or a copper plate of copper alloy for formation of the electrodes 21 of the wiring layer 2. The ABF is formed of a dry film type insulating material containing a resin material, and this film is used as an interlayer insulator for the wiring layer 2. In this preferred embodiment, the release plate 6 is formed from a copper plate for prevention of adherence to the pressure plate 204.

Similarly, the electrode plate 4 may be formed from a copper plate of copper alloy for prevention of adherence to the pressure plate 203, a resin film such as ABF, or a copper plate of copper alloy for formation of electrodes. In this preferred embodiment, the electrode plate 4 is formed from a copper plate for formation of electrodes. However, a resin film such as ABF may be used as the electrode plate 4.

As depicted in FIG. 5, the pressing machine 205 has the lower pressure plate 203 and the upper pressure plate 204 opposed to each other. The electrode plate 4 is placed on the lower pressure plate 203, and the upper pressure plate 204 is lowered toward the release plate 6 to thereby press the release plate 6, the sheet laminate 3, and the electrode plate 4 in their stacked condition as heating the sheet laminate 3. That is, at least one of the pressure plates 203 and 204 of the pressing machine 205 includes a heating unit such as a heater, so as to heat the sheet laminate 3 in applying a pressure thereto.

Thus, in the core member forming step ST2, the sheet laminate 3 is pressed and heated, so that the release plate 6 and the electrode plate 4 stacked on both sides of the sheet laminate 3 are attached to the sheet laminate 3. That is, the release plate 6, the sheet laminate 3, and the electrode plate 4 are united together to form the core member 7. Thereafter, the method proceeds to the front grinding step ST3.

Front Grinding Step

Figure 7:
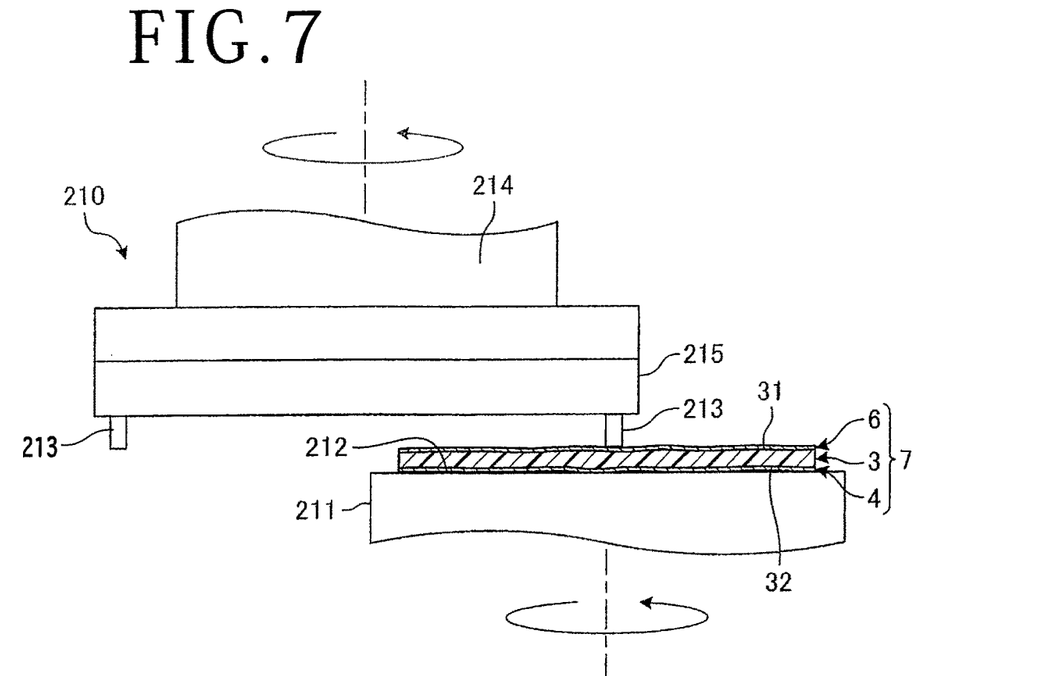
FIG. 7 is a schematic partially sectional side view depicting an initial stage of a front grinding step in the wiring board manufacturing method depicted in FIG. 2.
Figure 8:
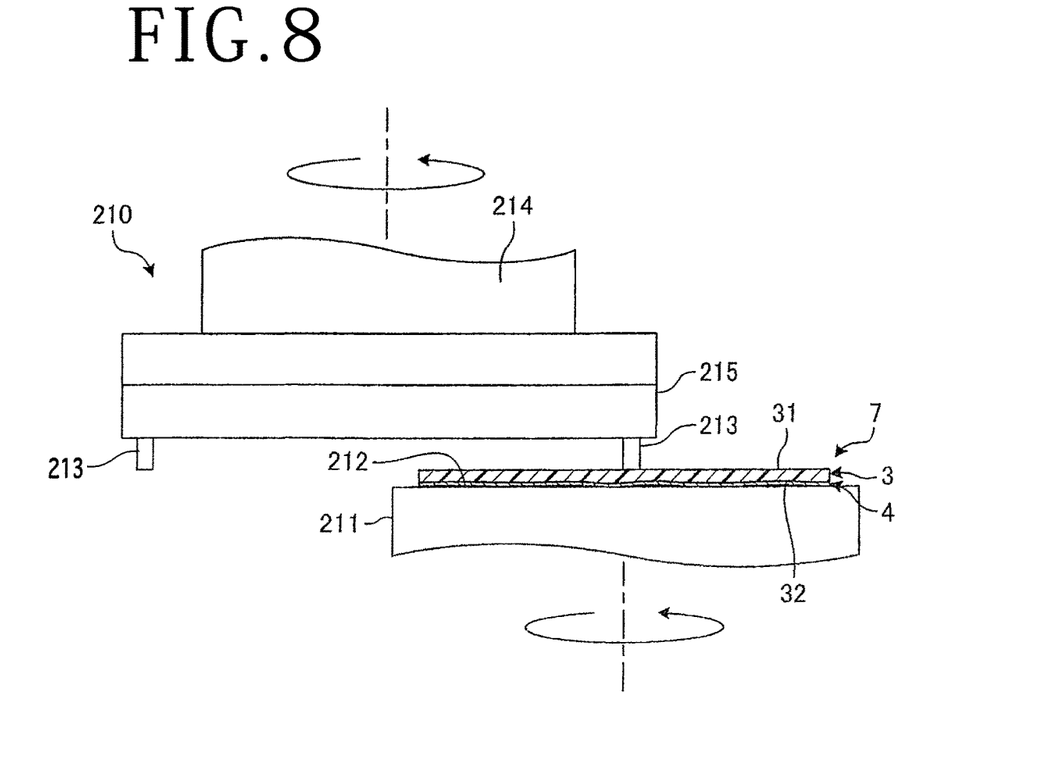
FIG. 8 is a view similar to FIG. 7, depicting a final stage of the front grinding step.
Figure 9:
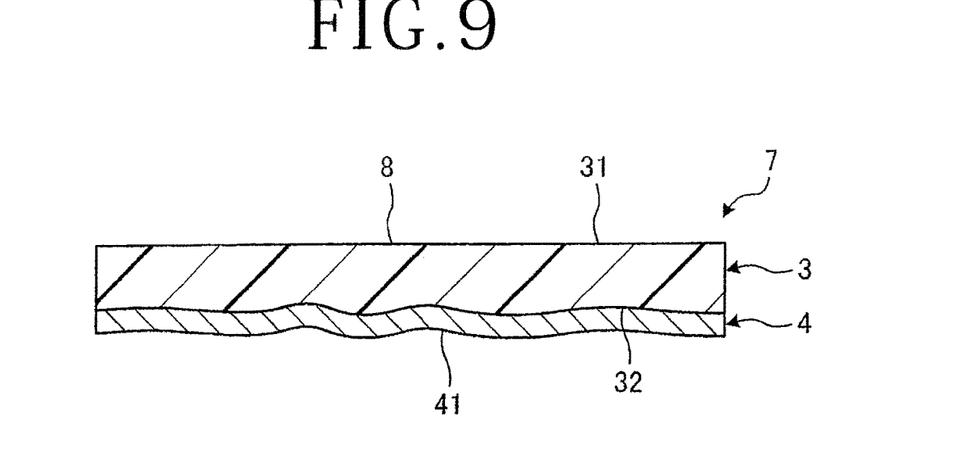
FIG. 9 is a schematic sectional view of the core member in the condition after the front grinding step.

FIG. 7 is a schematic partially sectional side view depicting the front grinding step ST3 depicted in FIG. 2 in its initial stage. FIG. 8 is a view similar to FIG. 7, depicting a final stage of the front grinding step ST3. FIG. 9 is a schematic sectional view of the core member 7 in the condition after the front grinding step ST3.

The front grinding step ST3 is a step of grinding the front side of the core member 7, i.e., the release plate 6 of the core member 7 by using a grinding apparatus 210 having abrasive members 213 in the condition where the electrode plate 4 of the core member 7 is held on a holding surface 212 of a chuck table 211 in the grinding apparatus 210, thereby making the thickness of the core member 7 uniform and removing at least a part of the release plate 6 to form a flat surface 8. More specifically, the front grinding step ST3 is performed by using the grinding apparatus 210 including the chuck table 211 having the holding surface 212 for holding the core member 7 under suction.

The chuck table 211 is rotatable about its vertical axis. The grinding apparatus 210 further includes a spindle 214 adapted to be rotated about its vertical axis and a grinding wheel 215 fixed to the lower end of the spindle 214. A plurality of abrasive members 213 are fixed to the lower surface of the grinding wheel 215 so as to be arranged along the outer circumference thereof. In performing the front grinding step ST3, the core member 7 is first held on the holding surface 212 of the chuck table 211 under suction in the condition where the electrode plate 4 is in contact with the holding surface 212, that is, the release plate 6 is exposed upward as depicted in FIG. 7. Thereafter, the spindle 214 is rotated to thereby rotate the grinding wheel 215. Further, the chuck table 211 is also rotated to thereby rotate the core member 7. Thereafter, the grinding wheel 215 is lowered at a predetermined feed speed to bring the abrasive members 213 into contact with the release plate 6 of the core member 7 held on the chuck table 211. At the same time, a grinding water is supplied to the abrasive members 213. Accordingly, the release plate 6 of the core member 7 is ground by the abrasive members 213. In this preferred embodiment, as depicted in FIGS. 8 and 9, the release plate 6 is entirely removed by this grinding to thereby make the first surface 31 of the sheet laminate 3 into the flat surface 8. That is, the front side of the core member 7 is ground until the release plate 6 is entirely removed and the first surface 31 of the sheet laminate 3 is flattened to become the flat surface 8. Thereafter, the method proceeds to the back grinding step ST4.

Back Grinding Step

Figure 10:
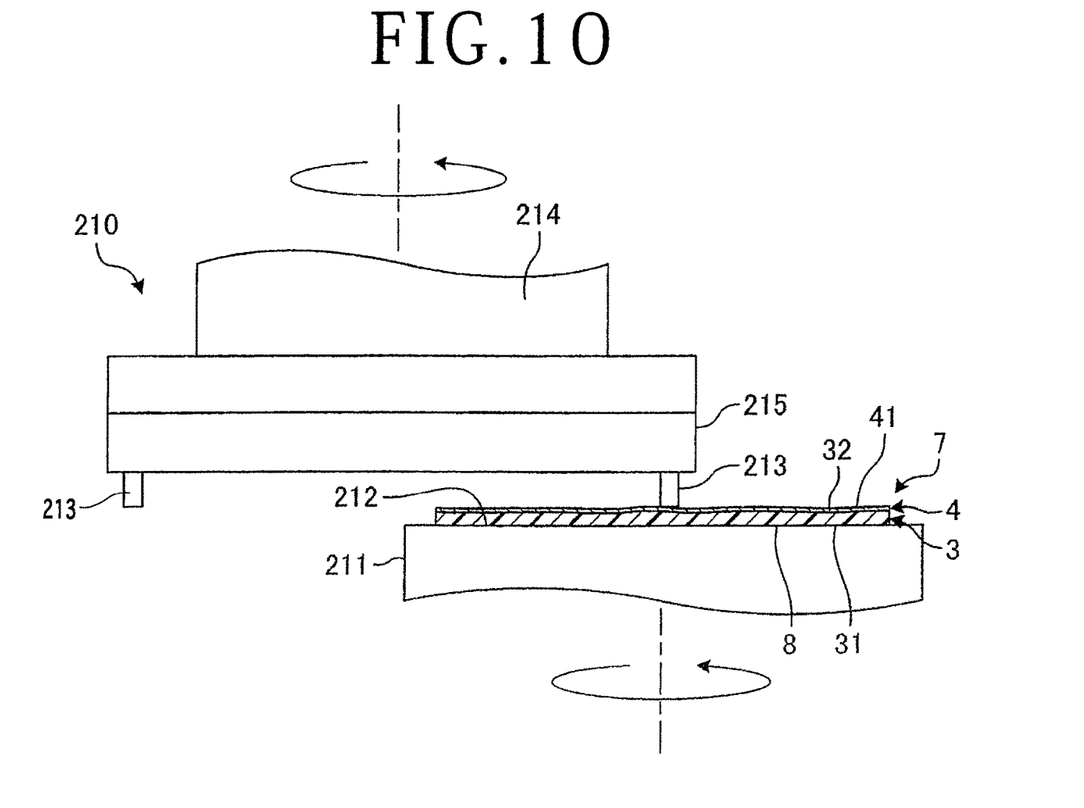
FIG. 10 is a schematic partially sectional view depicting a back grinding step in the wiring board manufacturing method depicted in FIG. 2.
Figure 11:
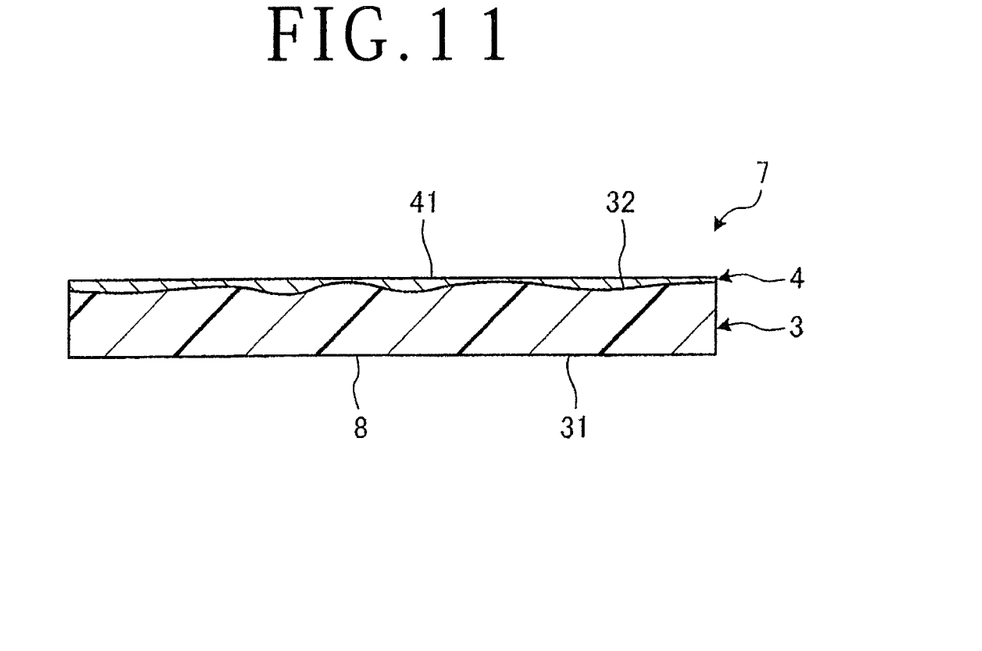
FIG. 11 is a schematic sectional view of the core member in the condition after the back grinding step.

FIG. 10 is a schematic partially sectional view depicting the back grinding step ST4 depicted in FIG. 2 in its initial stage. FIG. 11 is a schematic sectional view of the core member 7 in the condition after the back grinding step ST4.

The back grinding step ST4 is a step of grinding the back side of the core member 7, i.e., the upper surface 41 of the electrode plate 4 of the core member 7 after performing the front grinding step ST3, thereby flattening the back side of the core member 7. In performing the back grinding step ST4, the core member 7 is first held on the holding surface 212 of the chuck table 211 in the grinding apparatus 210 under suction in the condition where the flat surface 8 of the core member 7 is in contact with the holding surface 212, that is, the electrode plate 4 is exposed upward as depicted in FIG. 10.

Thereafter, the spindle 214 is rotated to thereby rotate the grinding wheel 215. Further, the chuck table 211 is also rotated to thereby rotate the core member 7. Thereafter, the grinding wheel 215 is lowered at a predetermined feed speed to bring the abrasive members 213 into contact with the upper surface 41 of the electrode plate 4 of the core member 7 held on the chuck table 211. At the same time, a grinding water is supplied to the abrasive members 213. Accordingly, the upper surface 41 of the electrode plate 4 of the core member 7 is ground by the abrasive members 213. In this preferred embodiment, as depicted in FIG. 11, the electrode plate 4 is partially removed by this grinding to thereby flatten the whole of the upper surface 41 of the electrode plate 4. That is, the back side of the core member 7 is ground until the electrode plate 4 is partially removed and the whole of the upper surface 41 (exposed surface) of the electrode plate 4 is flattened. Thereafter, the method proceeds to the first wiring layer forming step ST5. In this preferred embodiment, the electrode plate 4 is formed from a resin film such as ABF or a copper plate for formation of electrodes, and the electrode plate 4 is partially removed so as to flatten the upper surface 41 of the electrode plate 4 in the back grinding step ST4. As a modification, the electrode plate 4 may be formed from a copper plate for prevention of adherence to the pressure plate. In this case, the electrode plate 4 may be entirely removed so as to flatten the second surface 32 of the sheet laminate 3 in the back grinding step ST4.

First Wiring Layer Forming Step

Figure 12:
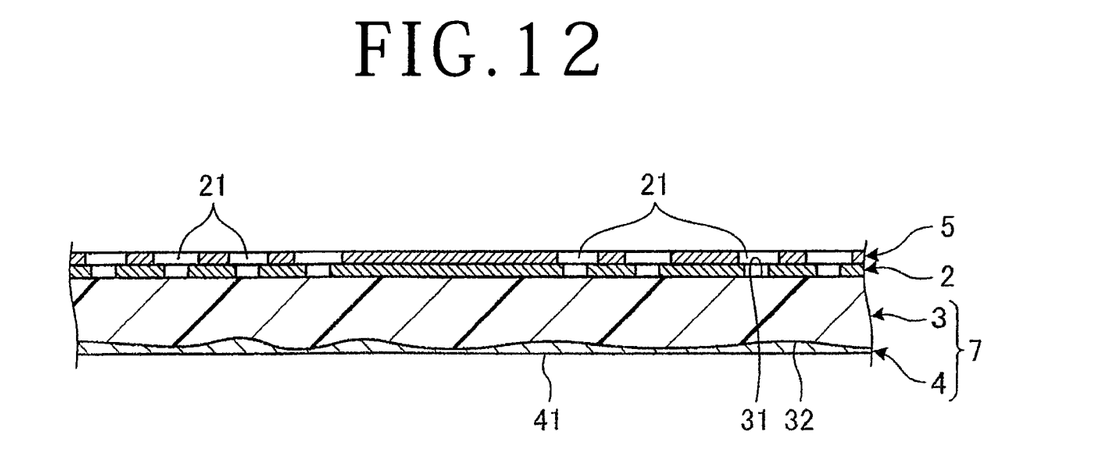
FIG. 12 is a schematic sectional view of the wiring board obtained by performing a first wiring layer forming step in the wiring board manufacturing method depicted in FIG. 2.

FIG. 12 is a schematic sectional view of the wiring board obtained by performing the first wiring layer forming step ST5 depicted in FIG. 2. The first wiring layer forming step ST5 is a step of forming a wiring layer 2 having electrodes 21 on the flat surface 8 formed in the front grinding step ST3, the electrodes 21 being adapted to be connected to the package device chips 100 (see FIG. 1).

In performing the first wiring layer forming step ST5, a copper foil is first bonded to the flat surface 8. Thereafter, a mask is formed on the copper foil by using a photolithography technique known in the art. Thereafter, this mask is etched and next removed, thereby forming the wiring layer 2 having the electrodes 21 arranged in a predetermined pattern. Thereafter, a resin film such as ABF is formed on the wiring layer 2 and next partially removed at suitable positions to thereby form an insulating layer 5 on the wiring layer 2. As described above, in this preferred embodiment, the wiring layer 2 is formed by first bonding a copper foil on the flat surface 8, next performing a known photolithography technique to form a mask, and next etching this mask. As a modification, the wiring layer 2 may be formed by first plating the flat surface 8 with metal, next forming a resin film such as ABF on the metal plating, next exposing the resin film to light, next plating the resin film with metal, and next polishing the metal plating. As another modification, screen printing or the like may be performed to form the wiring layer 2 on the flat surface 8.

In the wiring board manufacturing method according to the first preferred embodiment described above, the release plate 6 is stacked on the first surface 31 of the sheet laminate 3 in the core member forming step ST2. Accordingly, it is possible to suppress the problem that the glass cloth 33 in the sheet laminate 3 may adhere to the pressure plate 204 due to the varnish 34 in the core member forming step ST2. Further, in the front grinding step ST3, the release plate 6 of the core member 7 is ground to make the first surface 31 into the flat surface 8. Accordingly, the wiring layer 2 can be formed on the flat surface 8 with no asperities. As a result, it is possible to suppress poor connection between the electrodes of the wiring board 1 and the electrodes of the package device chips 100 as the components to be mounted on the front side of the wiring board 1 according to the first preferred embodiment.

Further, in the wiring board manufacturing method according to the first preferred embodiment, the upper surface 41 of the electrode plate 4 is ground to be flattened in the back grinding step ST4. Accordingly, also in forming another wiring layer on the back side of the core member 7, it is possible to suppress poor connection between the electrodes of the wiring layer formed on the back side of the wiring board 1 and the electrodes of any other components to be mounted on the back side of the wiring board 1. Further, in the wiring board manufacturing method according to the first preferred embodiment, the front grinding step ST3 is performed by using the abrasive members 213, so that the first surface 31 of the sheet laminate 3 can be flattened.

Second Preferred Embodiment

Figure 13:
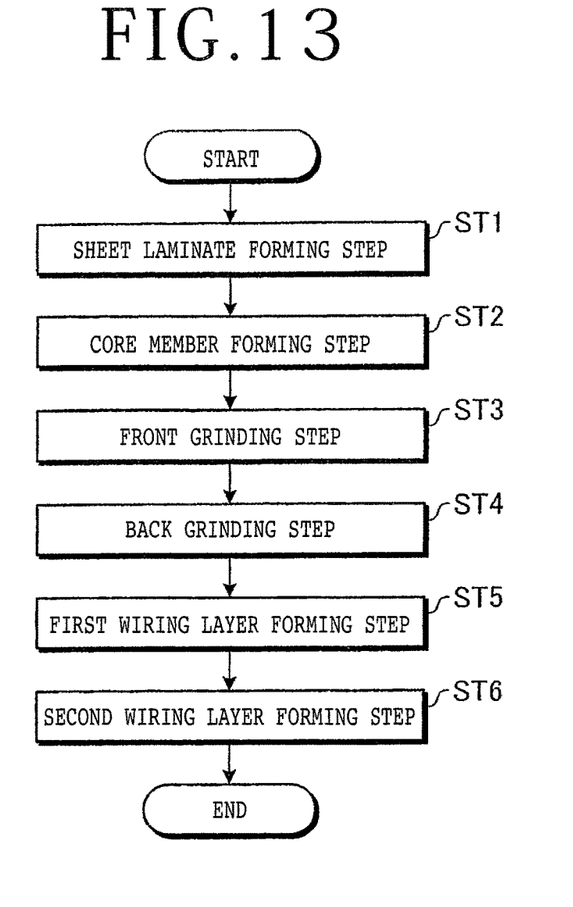
FIG. 13 is a flowchart depicting the flow of a wiring board manufacturing method according to a second preferred embodiment of the present invention.
Figure 14:
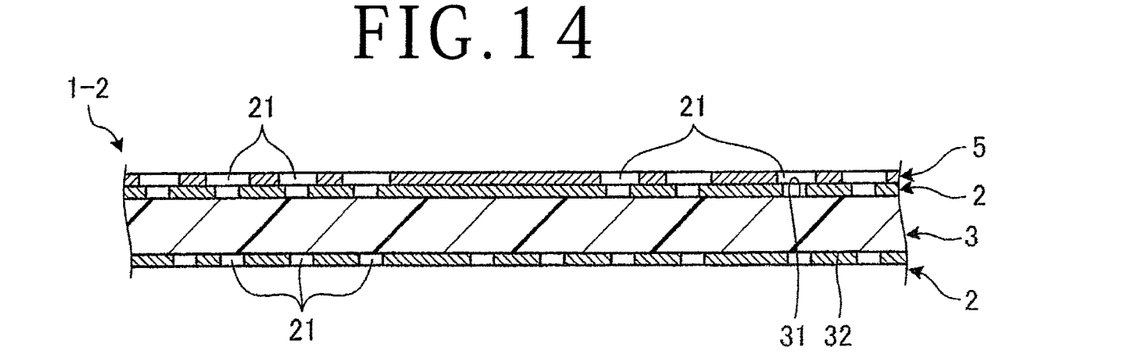
FIG. 14 is a schematic sectional view of a wiring board obtained by performing a second wiring layer forming step in the wiring board manufacturing method depicted in FIG. 13.

A wiring board manufacturing method according to a second preferred embodiment of the present invention will now be described with reference to the drawings. FIG. 13 is a flowchart depicting the flow of the wiring board manufacturing method according to the second preferred embodiment. FIG. 14 is a schematic sectional view of a wiring board obtained by performing a second wiring layer forming step in the wiring board manufacturing method depicted in FIG. 13. In FIGS. 13 and 14, the same parts as those in the first preferred embodiment are denoted by the same reference numerals and the description thereof will be omitted.

The wiring board manufacturing method according to the second preferred embodiment is the same as that according to the first preferred embodiment except that a second wiring layer forming step ST6 is performed after performing the first wiring layer forming step ST5. The second wiring layer forming step ST6 is a step of forming another wiring layer 2 on the electrode plate 4 of the core member 7. That is, after performing the first wiring layer forming step ST5, the wiring layer 2 is formed on the upper surface 41 of the electrode plate 4 as obtained by the back grinding step ST4 in a manner similar to that of the first preferred embodiment. Accordingly, a wiring board 1-2 having the wiring layers 2 on both sides can be manufactured as depicted in FIG. 14. In the second preferred embodiment, the electrode plate 4 is formed from a copper plate for forming the electrodes 21.

In the wiring board manufacturing method according to the second preferred embodiment, the release plate 6 is stacked on the first surface 31 of the sheet laminate 3 in the core member forming step ST2. Accordingly, it is possible to suppress the problem that the glass cloth 33 in the sheet laminate 3 may adhere to the pressure plate 204 in the core member forming step ST2. Further, in the front grinding step ST3, the release plate 6 of the core member 7 is ground to make the first surface 31 into the flat surface 8. Accordingly, the wiring layer 2 can be formed on the flat surface 8 with no asperities. Further, in the wiring board manufacturing method according to the second preferred embodiment, the upper surface 41 of the electrode plate 4 is ground to be flattened in the back grinding step ST4. Accordingly, the wiring layer 2 can also be formed on the flat second surface 32 of the sheet laminate 3 on the back side of the wiring board 1-2. As a result, it is possible to suppress poor connection between the electrodes of the wiring board 1-2 and the electrodes of the package device chips 100 as the components to be mounted on the front side of the wiring board 1-2. It is also possible to suppress poor connection between the electrodes of the wiring board 102 and the electrodes of any other components to be mounted on the back side of the wiring board 1-2.

First Modification

Figure 15:
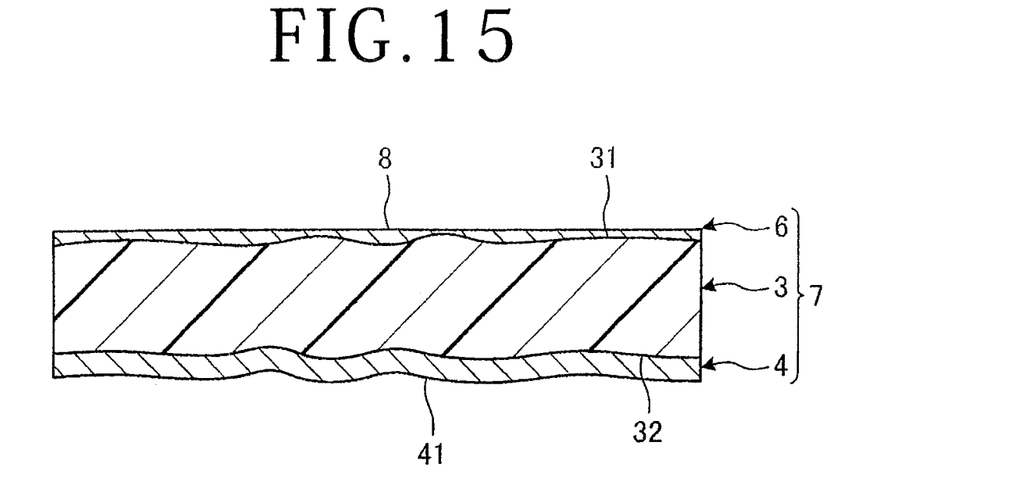
FIG. 15 is a schematic sectional view of the core member after the front grinding step in a first modification.

A wiring board manufacturing method according to a first modification of the above preferred embodiments will now be described with reference to FIG. 15. FIG. 15 is a schematic sectional view of the core member 7 after the front grinding step ST3 in the wiring board manufacturing method according to the first modification. In FIG. 15, the same parts as those in the above preferred embodiments are denoted by the same reference numerals and the description thereof will be omitted.

The wiring board manufacturing method according to the first modification is the same as that according to the above preferred embodiments except that the front grinding step ST3 is different. In the first modification, the release plate 6 is formed from a resin film such as ABF or a copper plate for forming electrodes.

In the front grinding step ST3 in the wiring board manufacturing method according to the first modification, the release plate 6 is partially removed by grinding to thereby make the upper surface of the release plate 6 into a flat surface 8 as depicted in FIG. 15. That is, unlike the core member 7 depicted in FIG. 9, the core member 7 depicted in FIG. 15 includes a part of the release plate 6. Thereafter, the method proceeds to the back grinding step ST4.

In the wiring board manufacturing method according to the first modification, the release plate 6 is stacked on the first surface 31 of the sheet laminate 3 and then partially ground to form the flat surface 8. Accordingly, as similar to the above preferred embodiments, it is possible to suppress poor connection between the electrodes of the wiring board 1 or 1-2 and the electrodes of the package device chips 100 as the components to be mounted on the front side of the wiring board 1 or 1-2 according to the first modification.

Second Modification

Figure 16:
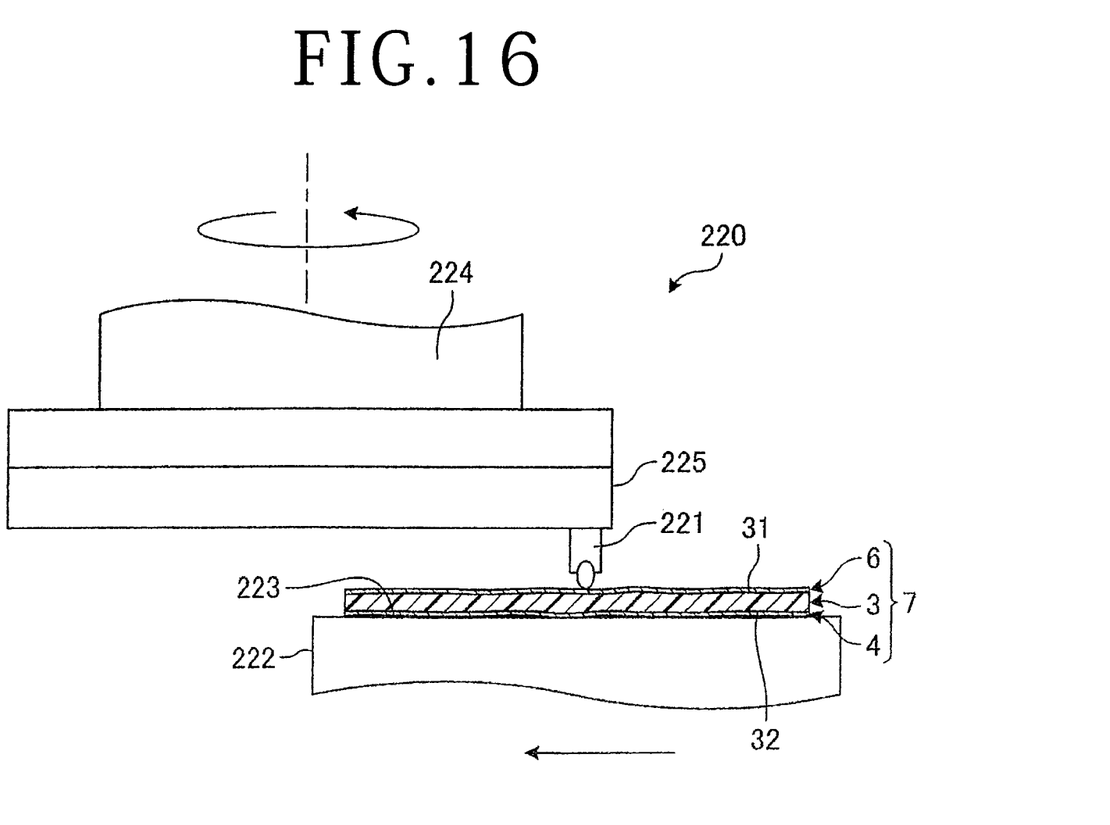
FIG. 16 is a schematic partially sectional side view depicting the front grinding step in a second modification.

A wiring board manufacturing method according to a second modification of the above preferred embodiments will now be described with reference to FIG. 16. FIG. 16 is a schematic partially sectional side view depicting the front grinding step ST3 in the wiring board manufacturing method according to the second modification. In FIG. 16, the same parts as those in the above preferred embodiments are denoted by the same reference numerals and the description thereof will be omitted.

The wiring board manufacturing method according to the second modification is the same as those according to the above preferred embodiments except that the front grinding step ST3 or the back grinding step ST4 is different. In the front grinding step ST3 according to the second modification, a cutting tool 221 is used to grind the core member 7, thereby forming the flat surface 8 as depicted in FIG. 16.

More specifically, the front grinding step ST3 according to the second modification is performed by using a single point tool grinding apparatus 220 including a chuck table 222 having a holding surface 223 for holding the core member 7 under suction. The holding surface 223 is formed from a metal pin chuck or the like.

The chuck table 222 is adapted to be horizontally moved. The single point tool grinding apparatus 220 further includes a spindle 224 adapted to be rotated about its vertical axis and a grinding wheel 225 fixed to the lower end of the spindle 224. A cutting tool 221 is fixed to the lower surface of the grinding wheel 225 at a position near the outer circumference thereof. In performing the front grinding step ST3, the core member 7 is first held on the holding surface 223 of the chuck table 222 under suction in the condition where the electrode plate 4 is in contact with the holding surface 223, that is, the release plate 6 is exposed upward as depicted in FIG. 16. Thereafter, the spindle 224 is rotated to thereby rotate the grinding wheel 225. Further, the chuck table 222 is horizontally moved. At the same time, the grinding wheel 225 is lowered to bring the cutting tool 221 into contact with the release plate 6 of the core member 7 held on the chuck table 222. Accordingly, the release plate 6 of the core member 7 is ground by the cutting tool 221.

In the wiring board manufacturing method according to the second modification, the release plate 6 is stacked on the first surface 31 of the sheet laminate 3 and then entirely ground to form the flat surface 8. Accordingly, as similar to the above preferred embodiments, it is possible to suppress poor connection between the electrodes of the wiring board 1 or 1-2 and the electrodes of the package device chips 100 as the components to be mounted on the front side of the wiring board 1 or 1-2 according to the second modification.

Third Modification

Figure 17:
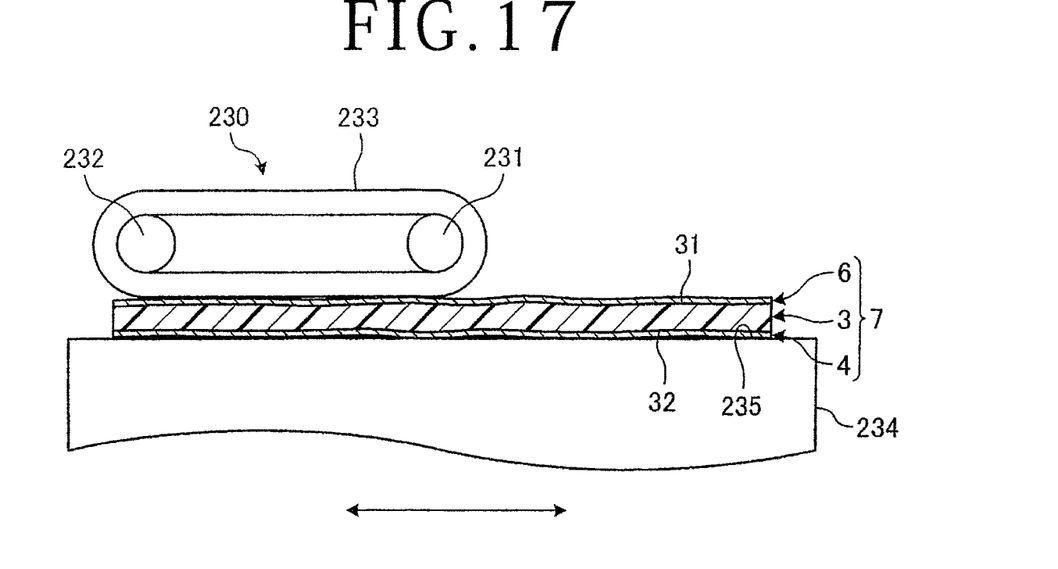
FIG. 17 is a schematic partially sectional side view depicting the front grinding step in a second modification.

A wiring board manufacturing method according to a third modification of the above preferred embodiments will now be described with reference to FIG. 17. FIG. 17 is a schematic partially sectional side view depicting the front grinding step ST3 in the wiring board manufacturing method according to the third modification. In FIG. 17, the same parts as those in the above preferred embodiments are denoted by the same reference numerals and the description thereof will be omitted.

The wiring board manufacturing method according to the third modification is the same as those according to the above preferred embodiments except the front grinding step ST3 or the back grinding step ST4 is different. In the front grinding step ST3 according to the third modification, a belt polishing machine 230 is used to grind the core member 7, thereby forming the flat surface 8 as depicted in FIG. 17. The belt polishing machine 230 includes a drive shaft 231 adapted to be rotated by a drive source such as a motor, a driven shaft 232 parallel to the drive shaft 231, and an endless polishing belt 233 wrapped between the drive shaft 231 and the driven shaft 232. The belt polishing machine 230 further includes a chuck table 234 having a holding surface 235 for holding the core member 7 under suction. The chuck table 234 is horizontally movable.

In performing the front grinding step ST3, the core member 7 is first held on the holding surface 235 of the chuck table 234 under suction in the condition where the electrode plate 4 is in contact with the holding surface 235, that is, the release plate 6 is exposed upward as depicted in FIG. 17. Thereafter, the chuck table 234 is horizontally moved. At the same time, the drive shaft 231 is operated to make the endless polishing belt 233 run between the drive shaft 231 and the driven shaft 232 (endless running or circulated running). The endless polishing belt 233 thus running is lowered to abut against the release plate 6 of the core member 7 held on the chuck table 234 as depicted in FIG. 17. Accordingly, the release plate 6 of the core member 7 is ground by the polishing belt 233.

In the wiring board manufacturing method according to the third modification, the release plate 6 is stacked on the first surface 31 of the sheet laminate 3 and then entirely ground to form the flat surface 8. Accordingly, as similar to the above preferred embodiments, it is possible to suppress poor connection between the electrodes of the wiring board 1 or 1-2 and the electrodes of the package device chips 100 as the components to be mounted on the front side of the wiring board 1 or 1-2 according to the third modification.

Fourth Modification

Figure 18:
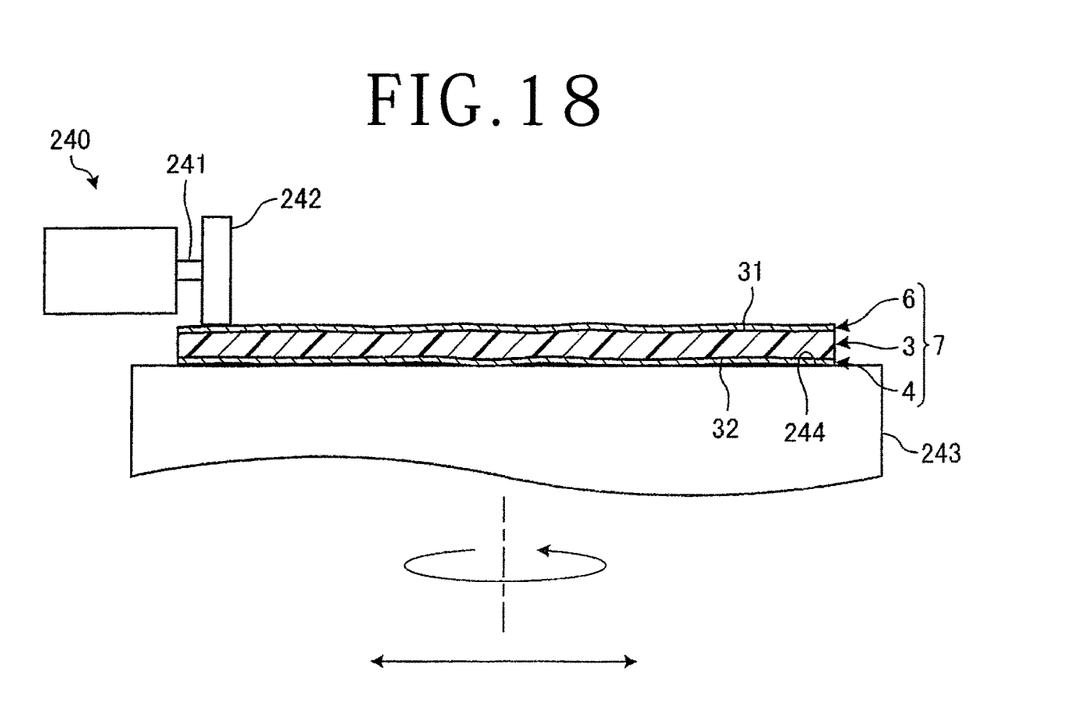
FIG. 18 is a schematic partially sectional side view depicting the front grinding step in a fourth modification.

A wiring board manufacturing method according to a fourth modification of the above preferred embodiments will now be described with reference to FIG. 18. FIG. 18 is a schematic partially sectional side view depicting the front grinding step ST3 in the wiring board manufacturing method according to the fourth modification. In FIG. 18, the same parts as those in the above preferred embodiments are denoted by the same reference numerals and the description thereof will be omitted.

The wiring board manufacturing method according to the fourth modification is the same as those of the above preferred embodiments except that the front grinding step ST3 is different. In the front grinding step ST3 according to the fourth modification, a cutting apparatus 240 is used to grind the core member 7, thereby forming the flat surface 8 as depicted in FIG. 18. The cutting apparatus 240 includes a spindle 241 adapted to be rotated about its horizontal axis and a cutting blade 242 fixed to the spindle 241. The cutting apparatus 240 further includes a chuck table 243 having a holding surface 244 for holding the core member 7 under suction. The chuck table 243 is rotatable about its vertical axis and movable horizontally. The axis of the spindle 241, i.e., the axis of the cutting blade 242 is parallel to the holding surface 244 of the chuck table 243.

In performing the front grinding step ST3, the core member 7 is first held on the holding surface 244 of the chuck table 243 under suction in the condition where the electrode plate 4 is in contact with the holding surface 244, that is, the release plate 6 is exposed upward as depicted in FIG. 18. Thereafter, the chuck table 243 is rotated and horizontally moved relative to the cutting blade 242. At the same time, the spindle 241 is rotated to thereby rotate the cutting blade 242. Thereafter, the cutting blade 242 is lowered to come into contact with the release plate 6 as depicted in FIG. 18. Accordingly, the release plate 6 of the core member 7 is ground by the cutting blade 242.

In the wiring board manufacturing method according to the fourth modification, the release plate 6 is stacked on the first surface 31 of the sheet laminate 3 and then entirely ground to form the flat surface 8. Accordingly, as similar to the above preferred embodiments, it is possible to suppress poor connection between the electrodes of the wiring board 1 or 1-2 and the electrodes of the package device chips 100 as the components to be mounted on the front side of the wiring board 1 or 1-2 according to the fourth modification.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wiring board manufacturing method for manufacturing a wiring board on which a plurality of package device chips having electrodes are mounted, the wiring board having electrodes connected to the electrodes of the package device chips, the wiring board manufacturing method comprising:

a sheet laminate forming step of impregnating a glass cloth with a synthetic resin to form a plurality of sheets and stacking the sheets to form a sheet laminate having a first surface and a second surface;

a core member forming step of stacking a release plate on the first surface of the sheet laminate, stacking an electrode plate on the second surface of the sheet laminate, and pressing the release plate, the sheet laminate, and the electrode plate together in a stacked condition by moving a pressure plate into contact with the release plate or the electrode plate, thereby uniting the release plate, the sheet laminate, and the electrode plate to form a core member, and moving the pressure plate away from the release plate or the electrode plate after uniting the release plate, the sheet laminate, and the electrode plate to form the core member;

a front grinding step of grinding the release plate of the core member as the front side of the core member in a condition where the electrode plate of the core member as the back side of the core member is held on a chuck table, thereby making a thickness of the core member uniform and removing all of the release plate to thereby form a flat surface on the front side of the core member; and a first wiring layer forming step of forming a wiring layer on the flat surface formed in the front grinding step, the wiring layer being adapted to be connected to the package device chips.

2. The wiring board manufacturing method according to claim 1, further comprising:

a second wiring layer forming step of forming another wiring layer on the electrode plate of the core member after performing the first wiring layer forming step.

3. The wiring board manufacturing method according to claim 1, wherein the front grinding step is performed by using abrasive members, cutting tool, polishing belt, or cutting blade.

4. The wiring board manufacturing method according to claim 1, wherein the release plate is formed from a copper plate or a resin film.

5. The wiring board manufacturing method according to claim 1, further comprising:

a back grinding step of grinding the electrode plate of the core member as the back side of the core member after performing the front grinding step, thereby flattening the back side of the core member.

6. The wiring board manufacturing method according to claim 1, wherein the core member forming step of stacking a release plate on the first surface of the sheet laminate, stacking an electrode plate on the second surface of the sheet laminate, further includes pressing the release plate, the sheet laminate, and the electrode plate together in the stacked condition by moving a first pressure plate into contact with the release plate and a second pressure plate into contact with the electrode plate, thereby uniting the release plate, the sheet laminate, and the electrode plate to form a core member, and then moving the first pressure plate away from the release plate and the second pressure plate away from the electrode plate after uniting the release plate, the sheet laminate, and the electrode plate to form the core member.

* * * * *